(12) United States Patent
Kojima

(10) Patent No.: US 7,473,910 B2
(45) Date of Patent: Jan. 6, 2009

(54) ELECTRON BEAM LITHOGRAPHY APPARATUS

(75) Inventor: Yoshiaki Kojima, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/593,476

(22) PCT Filed: Mar. 22, 2005

(86) PCT No.: PCT/JP2005/005638

§ 371 (c)(1), (2), (4) Date: Sep. 20, 2006

(87) PCT Pub. No.: WO2005/091079

PCT Pub. Date: Sep. 29, 2005

(65) Prior Publication Data

US 2007/0160932 A1    Jul. 12, 2007

(30) Foreign Application Priority Data

Mar. 23, 2004    (JP) .............................. 2004-084464

(51) Int. Cl.
*G21K 5/10* (2006.01)

(52) U.S. Cl. .............................. 250/492.22; 250/492.1

(58) Field of Classification Search .................. 430/296, 430/942; 250/492.1–492.3
See application file for complete search history.

(56) References Cited

U.S. PATENT DOCUMENTS

| | | | |
|---|---|---|---|
| 4,467,211 A * | 8/1984 | Smith et al. .............. | 250/492.2 |
| 5,446,722 A | 8/1995 | Kojima et al. | |
| 6,307,826 B1 | 10/2001 | Katsumura et al. | |
| 6,482,493 B1 | 11/2002 | Kim | |
| 6,911,656 B2 | 6/2005 | Liu et al. | |
| 6,985,425 B2 | 1/2006 | Tsukuda et al. | |
| 7,113,360 B2 | 9/2006 | Formato et al. | |
| 7,135,676 B2 * | 11/2006 | Nakasuji et al. ............. | 250/310 |
| 7,200,095 B2 | 4/2007 | Kojima et al. | |
| 7,203,144 B2 | 4/2007 | Kumasaka et al. | |

(Continued)

FOREIGN PATENT DOCUMENTS

JP       02-015889       1/1990

(Continued)

OTHER PUBLICATIONS

International Search Report dated May 10, 2005 with translation of relevant portions.

*Primary Examiner*—Jack I Berman
*Assistant Examiner*—Andrew Smyth
(74) *Attorney, Agent, or Firm*—Steve A. Wong

(57) ABSTRACT

An apparatus includes a beam deflection portion for deflecting the electron beam to change an irradiation position of the electron beam; a synchronization signal generation portion for generating a synchronization signal which is in synchronization with the rotation of the substrate; a controller for controlling the beam deflection portion on the basis of the synchronization signal in order to deflect the electron beam in a rotational radial direction of the substrate and in a rotational tangential direction of the substrate opposite to a rotational direction of the substrate, while drawing transition is performed from one circle to another circle; and a beam cutoff portion for cutting off the irradiation of the electron beam on the substrate, for a period during the electron beam is deflected in the rotational radial direction.

13 Claims, 13 Drawing Sheets

U.S. PATENT DOCUMENTS

| | | |
|---|---|---|
| 7,218,470 B2 * | 5/2007 | Deeman et al. ............... 360/75 |
| 7,336,585 B2 | 2/2008 | Kumasaka et al. |
| 7,359,305 B2 | 4/2008 | Tsukuda et al. |
| 2002/0033449 A1 * | 3/2002 | Nakasuji et al. ............. 250/306 |
| 2002/0186632 A1 | 12/2002 | Kumasaka et al. |
| 2004/0021976 A1 * | 2/2004 | Deeman et al. ............... 360/75 |

FOREIGN PATENT DOCUMENTS

| | | |
|---|---|---|
| JP | 06-103615 | 4/1994 |
| JP | 06-243510 | 9/1994 |
| JP | 2002-367178 | 12/2002 |

* cited by examiner

ELECTRON BEAM LITHOGRAPHY APPARATUS

TECHNICAL FIELD

The present invention relates to an electron beam lithography apparatus for manufacturing an original master, and in particular, relates to the electron beam lithography apparatus used for concentrically drawing circles.

BACKGROUND ART

A magnetic disk or a hard disk (HD) is used as a storage of a personal computer (PC), a mobile device, a car-mounted device, and the like. The application thereof significantly expands, and surface recording density is rapidly improved in recent years.

To manufacture such a hard disk with high recording density, electron beam mastering technology is widely studied. In an electron beam lithography exposure apparatus, an electron lens converges an electron beam shot by an electron gun, and an electron beam spot is applied to a substrate coated with a resist. A blanking control system and a beam deflection control system control the irradiation position of the electron beam spot to draw a desired beam pattern. Recently various electron beam lithography exposure apparatuses are developed and include, for example, an apparatus which precisely manufactures an original master of a recording medium such as an optical disk and the like (refer to, for example, Japanese Patent Laid-Open Publication No. 2002-367178).

Accordingly, it is necessary to precisely control the irradiation position of the electron beam spot in order to perform electron beam lithography with high recording density. The recent hard disk uses a concentric pattern instead of a spiral pattern used in the optical disk and the like. In the case of concentrically drawing circles by the electron beam lithography, it is necessary to precisely connect a start point to an end point in each circle (i.e., track). Therefore, it is desired to provide an apparatus which can concentrically draw circles with high precision.

When a conventional x-θ system lithography apparatus or the like concentrically draws circles by the electron beam lithography, a ramp wave in synchronization with the rotation of the substrate deflects the electron beam to a radial direction. Thus, there are problems that the shape of a circle connecting section becomes distorted, a part of a land section is exposed, and the like. If there is rotational fluctuation in a rotational stage, a line for a circle may not connect at the start and end points. Using blanking prevents the land section from being exposed, but there occurs another problem that a line does not connect at the start and end points. Accordingly, it is desired to provide an electron beam lithography apparatus which can draw a circle with high precision.

DISCLOSURE OF THE INVENTION

To solve the foregoing problems, an object of the present invention is to provide an electron beam lithography apparatus which can concentrically draw circles by electron beam lithography in such a manner that a start point and an end point of the circle connect with high precision.

According to the present invention, there is provided an electron beam lithography apparatus for concentrically drawing a plurality of circles on a substrate by applying an electron beam while rotating the substrate, which comprises a beam deflection portion for deflecting the electron beam to change an irradiation position of the electron beam; a synchronization signal generation portion for generating a synchronization signal which is in synchronization with the rotation of the substrate; a controller for controlling the beam deflection portion on the basis of the synchronization signal in order to deflect the electron beam in a rotational radial direction of the substrate and in a rotational tangential direction of the substrate opposite to a rotational direction of the substrate, while drawing transition is performed from one circle to another circle; and a beam cutoff portion for cutting off the irradiation of the electron beam on the substrate, for a period during the electron beam is deflected in the rotational radial direction.

According to the present invention, there is provided an electron beam lithography method for drawing a plurality of circles on a substrate by applying an electron beam while rotating the substrate, which comprises a cutoff step of cutting off the irradiation of the electron beam on the substrate during drawing a circle; and a drawing start step of deflecting the electron beam in at least a rotational radial direction of the substrate during cutoff, and starting the drawing of another circle.

BEST MODE FOR CARRYING OUT THE INVENTION

Figure 1:
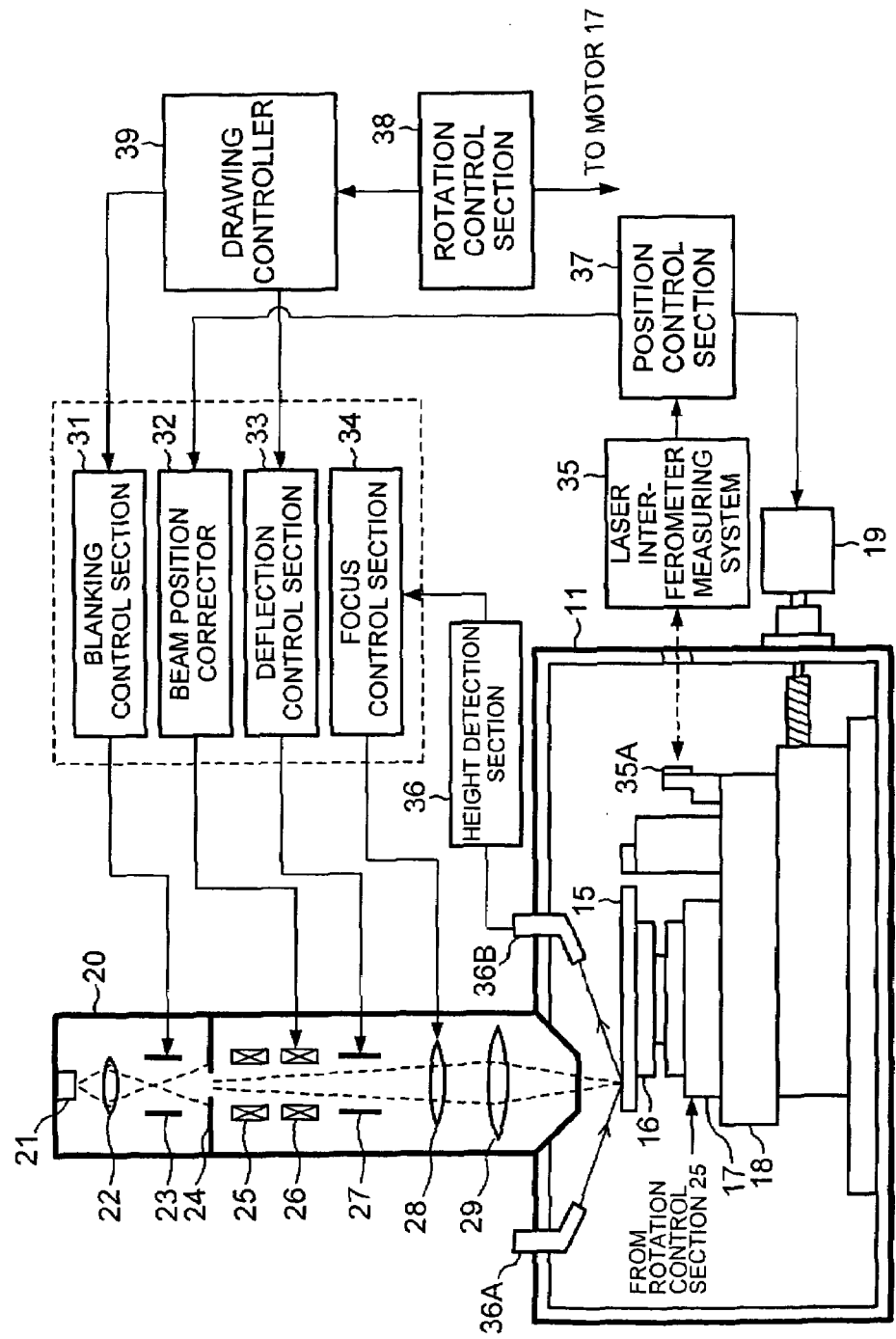
FIG. 1 is a block diagram schematically showing the structure of an electron beam lithography apparatus according to a first embodiment of the present invention.

Embodiments of the present invention will be hereinafter described in detail with reference to drawings. In the following embodiments, the same reference numerals refer to equivalent components.

First Embodiment

FIG. 1 is a block diagram schematically showing the structure of an electron beam lithography apparatus 10 according to a first embodiment of the present invention. The electron beam lithography apparatus 10 is a mastering apparatus which produces an original master for manufacturing magnetic disks by use of an electron beam.

The electron beam lithography apparatus 10 comprises a vacuum chamber 11, a drive device, an electron beam column 20 attached to the vacuum chamber 11, and various circuits and control systems. The drive device performs rotational and translational movement of a substrate mounted thereon and disposed in the vacuum chamber 11. The various circuits and control systems carry out substrate drive control, electron beam control, and the like.

To be more specific, a substrate 15 for an original master of a disk is mounted on a turntable 16. The turntable 16 is rotated by a spindle motor 17, which is a rotational drive device for driving the substrate 15 to rotate, with respect to a vertical axis of the principal plane of the substrate 15. The spindle motor 17 is disposed on a feed stage (hereinafter, simply referred to as stage) 18. The stage 18 is coupled to a feed motor 19 being a feeding (translational motion drive) device. Thus, the spindle motor 17 and the turntable 16 can be moved in a predetermined direction in a plane which is in parallel with the principal plane of the substrate 15.

The turntable 16 is made of dielectric, for example, ceramic, and has an electrostatic chucking mechanism (not illustrated). The electrostatic chucking mechanism is composed of the turntable 16 (ceramic) and an electrode provided in the turntable 16. The electrode made of a conductive material generates electrostatic polarization. The electrode is connected to a high-voltage power supply (not illustrated). Since the high-voltage power supply applies voltage to the electrode, the substrate 15 is attracted and held.

Optical elements are disposed on the stage 18. The optical elements include a reflecting mirror 35A, an interferometer, and the like, which are elements of a laser interferometer measuring system 35 described later.

The vacuum chamber 11 is installed through a vibration isolating table (not illustrated) such as an air damper or the like in order to restrain the transmission of external vibration. The vacuum chamber 11 is connected to a vacuum pump (not illustrated). The vacuum pump exhausts air from the vacuum chamber 11, so that the inside of the vacuum chamber 11 is set at a vacuum atmosphere with a predetermined pressure.

In the electron beam column 20, an electron gun (emitter) 21 for emitting an electron beam, a convergence lens 22, blanking electrodes 23, an aperture 24, a beam deflection coil 25, an alignment coil 26, deflection electrodes 27, a focus lens 28, and an objective lens 29 are disposed in this order.

The electron gun 21 emits an electron beam (EB) accelerated to several tens of KeV by a cathode (not illustrated), to which an acceleration high voltage power supply (not illustrated) applies high voltage. The convergence lens 22 converges the emitted electron beam. The blanking electrodes 23 switch the electron beam between ON and OFF on the basis of a modulation signal from a blanking control section 31. In other words, since application of a voltage between the blanking electrodes 23 largely deflects the passing electron beam, the electron beam is prevented from passing through the aperture 24, so that the electron beam becomes an off state.

The alignment coil 26 corrects the position of the electron beam on the basis of a correction signal from a beam position corrector 32. The deflection electrodes 27 can carry out the deflection control of the electron beam at high speed on the basis of a control signal from a deflection control section 33. The deflection control results in position control of an electron beam spot with respect to the substrate 15. The focus lens 28 controls the focus of the electron beam on the basis of a control signal from a focus control section 34.

A light source 36A and a photo detector 36B are provided in the vacuum chamber 11 to detect the height of the principal plane of the substrate 15. In the electron beam lithography apparatus 10, a height detection section 36 is provided. The photodetector 36B includes, for example, a position sensor, a CCD (charge coupled device), and the like. The photodetector 36B receives a light beam, which is emitted from the light source 36A and reflected from the surface of the substrate 15, and provides the height detection section 36 with a photo-reception signal. The height detection section 36 detects the height of the principal plane of the substrate 15 on the basis of the photo-reception signal, and generates a detection signal. The detection signal representing the height of the principal plane of the substrate 15 is provided to the focus control section 34, so that the focus control section 34 controls the focus of the electron beam on the basis of the detection signal.

The laser interferometer measuring system 35 measures a distance to the stage 18 by use of a distance measuring laser beam from a light source provided in the laser interferometer measuring system 35. Then, the laser interferometer measuring system 35 sends distance measurement data, that is, position data of the stage 18 to a position control section 37. The position control section 37 generates a position correction signal for correcting the position of the electron beam from the position data, and sends the position correction signal to the beam position corrector 32. The beam position corrector 32, as described above, corrects the position of the electron beam on the basis of the position correction signal. The position control section 37 also generates a position control signal for controlling the feed motor 19, and provides the position control signal to the feed motor 19.

A rotation control section 38 controls the rotation of the spindle motor 17. The rotation control section 38 sends a rotation synchronization signal of the spindle motor 17 to a drawing controller 39. The rotation synchronization signal includes a signal representing a reference rotational position of the substrate 15 and a pulse signal on a predetermined rotational angle basis with respect to the reference rotational position. The rotation control section 38 obtains a rotational angle, a rotational speed, a rotational frequency, and the like of the substrate 15 from the rotation synchronization signal. The drawing controller 39 sends a blanking control signal to the blanking control section 31, and sends a deflection control signal to the deflection control section 33 to carry out drawing control. The drawing control, as described later, is carried out in synchronization with the above-described rotational signal of the spindle motor 17. Main signal lines of the blanking control section 31, the beam position corrector 32, the deflection control section 33, the focus control section 34, the position control section 37, and the rotation control section 38 are described above, but each of these components is bidirectionally connected to the drawing controller 39. Each component of the electron beam lithography apparatus 10 is appropriately connected to a not-illustrated system controller for controlling the whole apparatus, and sends and receives necessary signals.

Then, an instance in which the electron beam lithography apparatus 10 draws (i.e., performs electron beam exposure) concentric patterns of an original master of a hard disk will be hereinafter described in detail.

Figure 2:
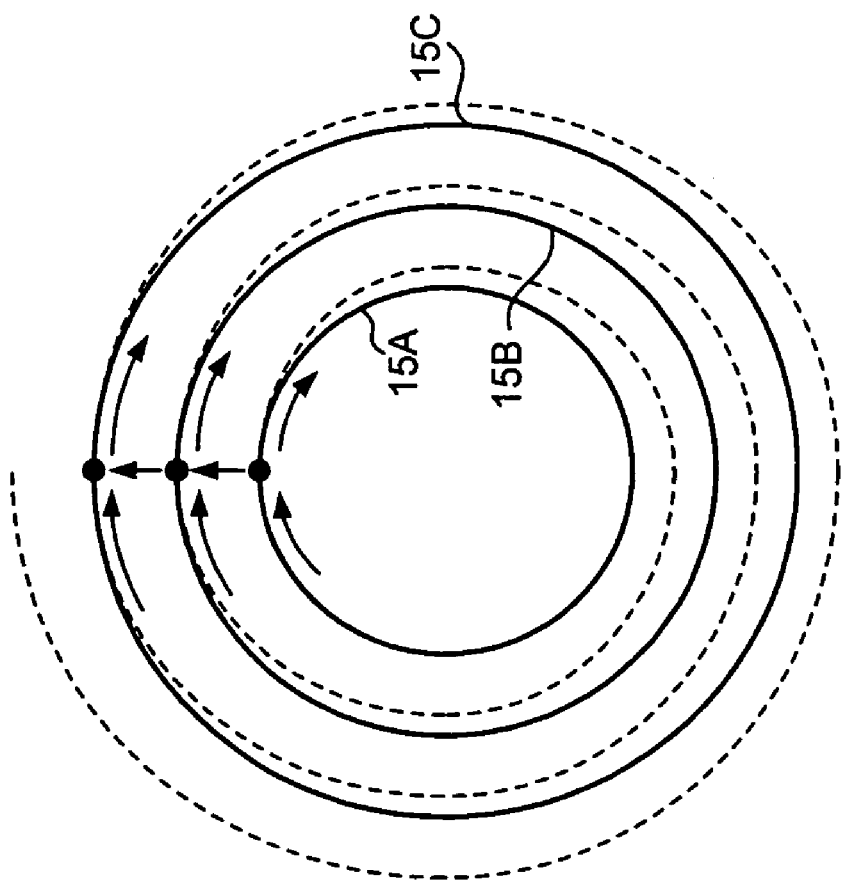
FIG. 2 is a plan view showing a spiral pattern (a broken line) and a concentric pattern (continuous lines) of a disk.

A track of the currently widely used hard disk, as shown in FIG. 2, is not a spiral pattern (shown by a broken line) adopted in an optical disk such as CDs, DVDs, and the like, but concentric patterns (shown by solid lines). An instance in which the electron beam lithography apparatus 10 (x-θ system lithography apparatus) successively draws the concentric patterns (15A, 15B, 15C, . . . and the like of FIG. 2) will be described for instance.

Figure 3:
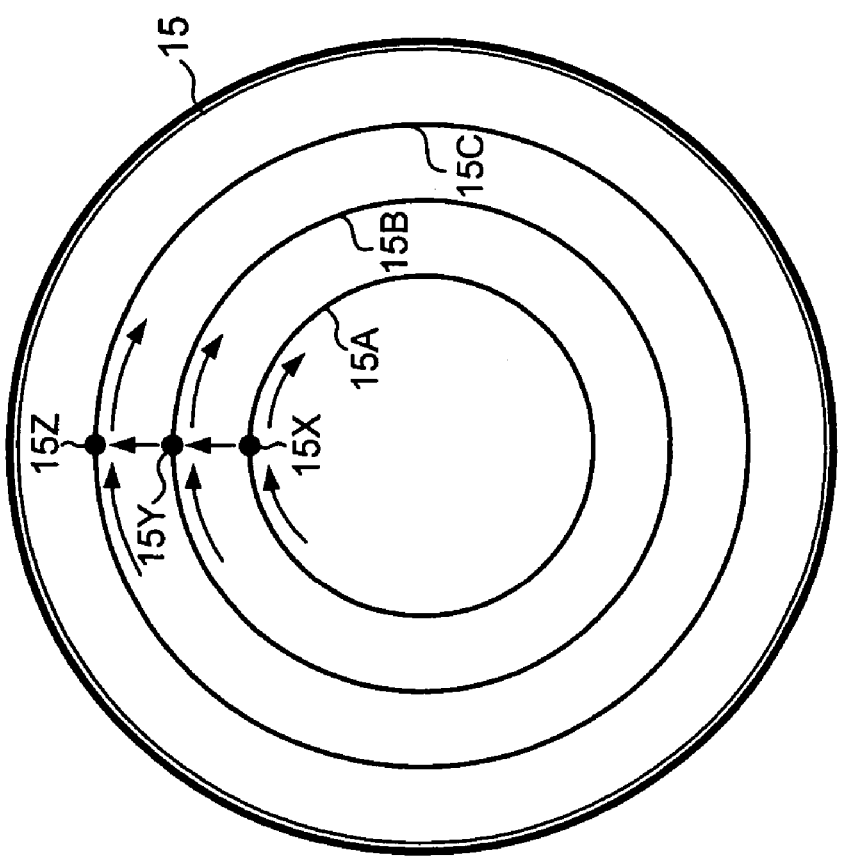
FIG. 3 is a schematic plan view for illustrating the case of drawing a plurality of concentric patterns on a substrate.

FIG. 3 is a plan view which schematically shows the case of drawing a plurality of concentric patterns on the substrate 15 being the original master of the hard disk. Electron beam lithography (electron beam exposure) is concentrically performed on the substrate 15 applied with a resist, as shown in the drawing, to draw circles (tracks) in such a manner that a start point and an end point of the concentric circle precisely connect to each other. In other words, drawing by the electron beam lithography is started from a start point 15X of a circle 15A, and the circle is drawn in such a manner that a drawing end point (an end point of the circle 15A) connects to 15X being the drawing start point. In the drawing, for the sake of convenience, the position of the start point and the end point (connection point) 15X of the circle 15A is indicated with a filled circle (•). Then, a circle 15B concentric with the circle 15A is drawn in a similar manner with using a point 15Y, which is an outside point of the drawing connection point 15X of the circle 15A in a radial direction, as a drawing connection point. Furthermore, a circle 15C concentric with the circles 15A and 15B is drawn in a similar manner with using a point 15Z, which is an outside point of the drawing connection point 15Y in the radial direction, as a drawing connection point. The drawing connection points 15X, 15Y, and 15Z are in a line in the same radial direction of the concentric circles 15A, 15B, and 15C, respectively. The concentric circles can be drawn in a similar manner inside of the radial direction.

Figure 4:
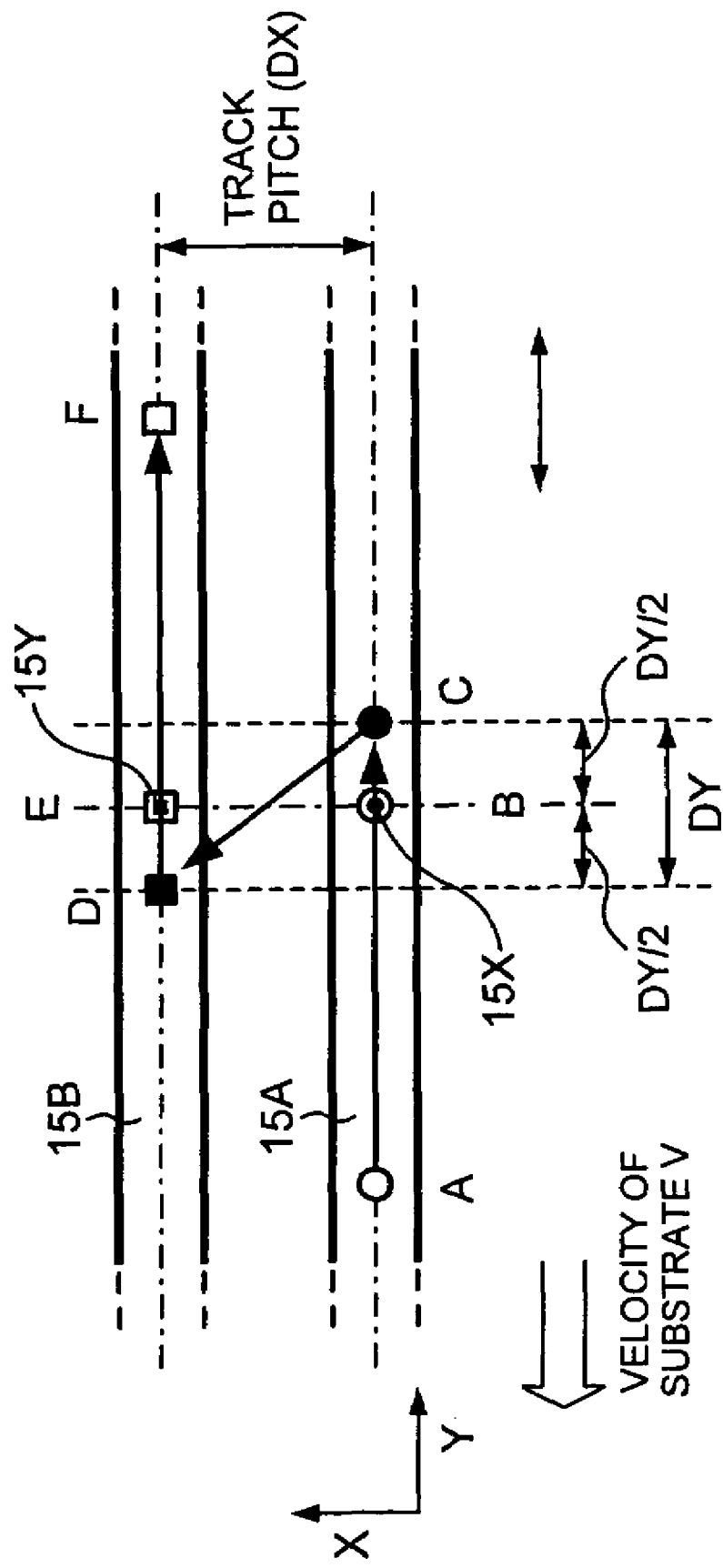
FIG. 4 is a schematic plan view for illustrating the case of drawing concentric circles 15A and 15B according to the first embodiment.
Figure 5:
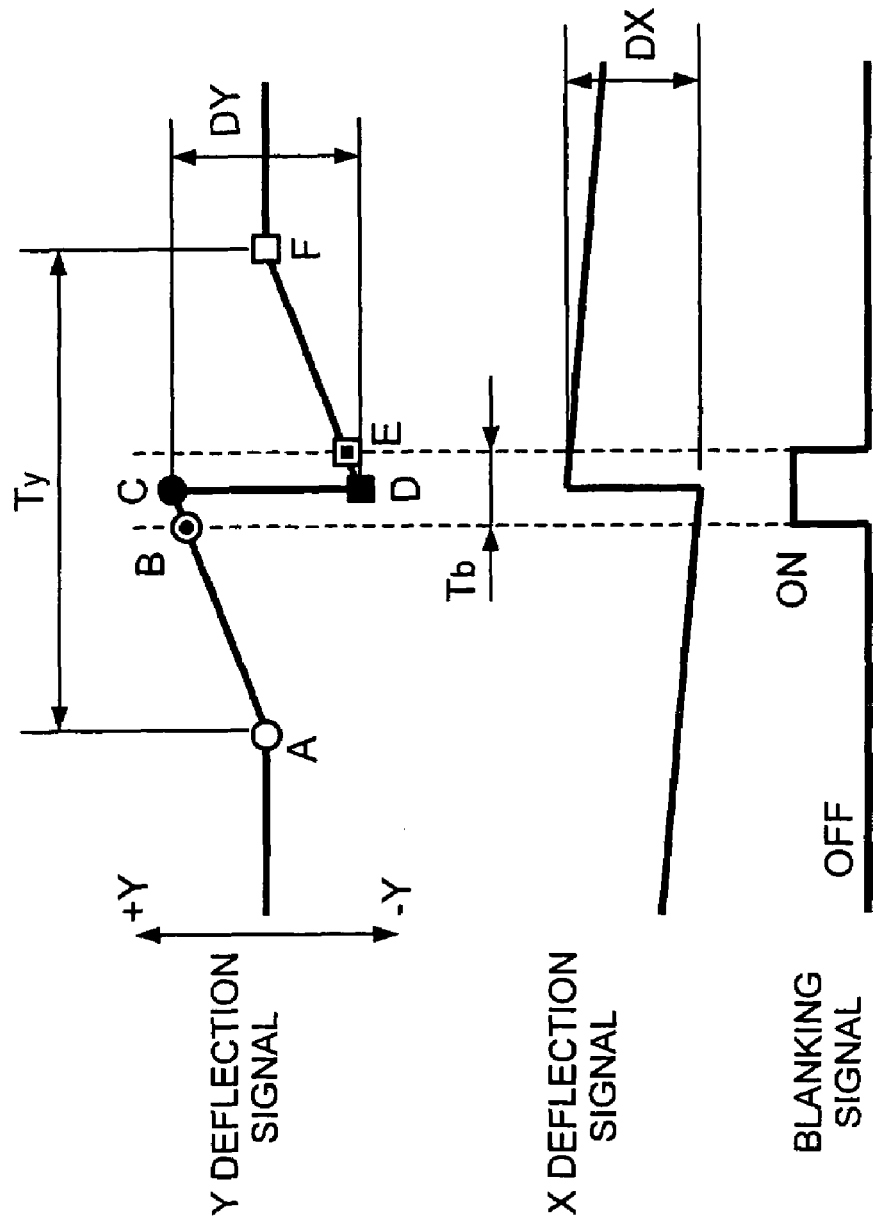
FIG. 5 is a time chart corresponding to FIG. 4 showing a blanking control signal and deflection control signals in X and Y directions.
Figure 6:
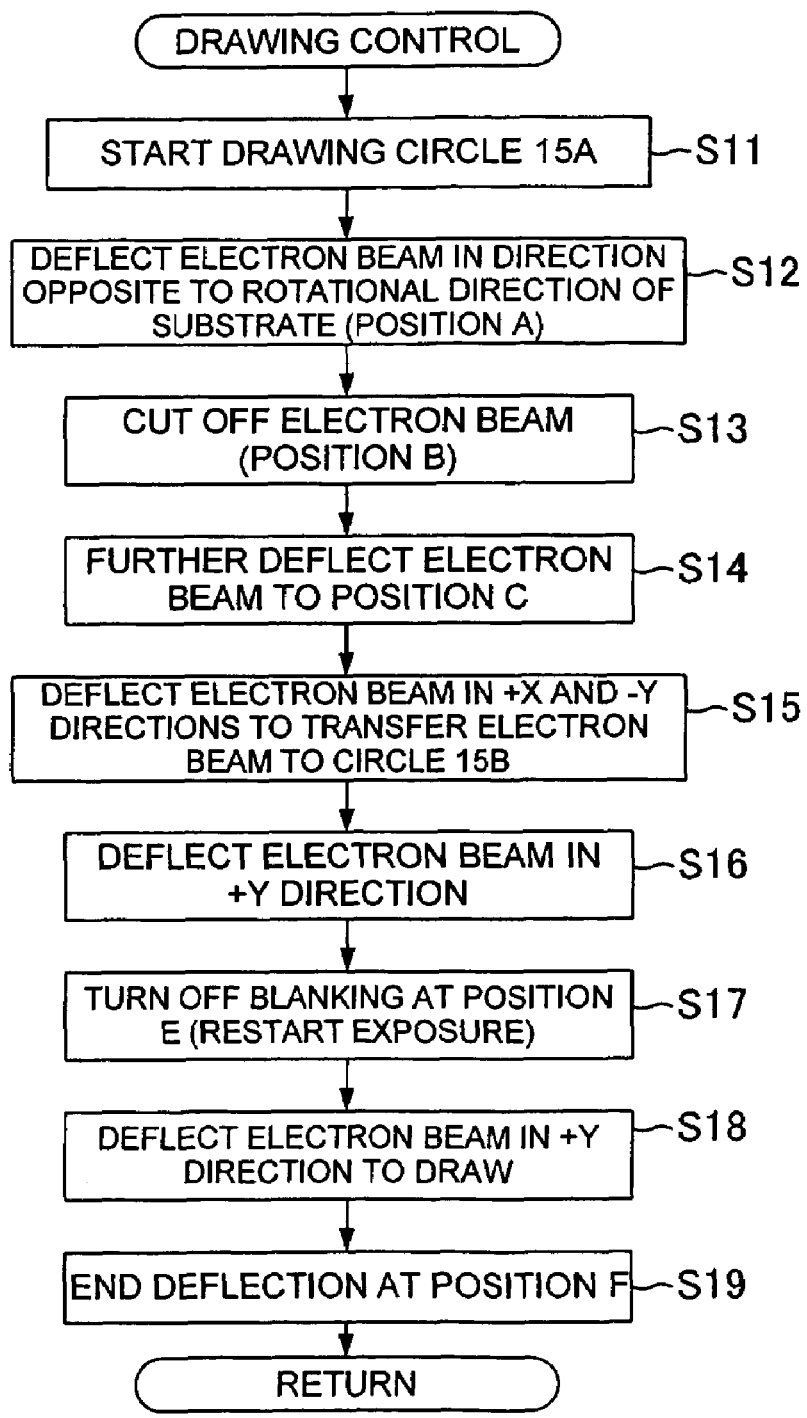
FIG. 6 is a flowchart showing the procedure of drawing shown in FIGS. 4 and 5.

FIG. 4 is a schematic plan view which illustrates the case of drawing the concentric circles 15A and 15B in such a manner that each circle precisely connects at the drawing connection point described above. The neighborhood of the drawing connection points (start point and end point) is enlarged in FIG. 4. FIG. 5 is a time chart corresponding to FIG. 4 which shows the blanking control signal and the deflection control signals in X and Y directions. FIG. 6 is a flowchart which shows the procedure steps of drawing. Taking a case in which the substrate 15 is rotated at constant linear velocity (CLV) as an example, the drawing control will be described.

Figure 7:
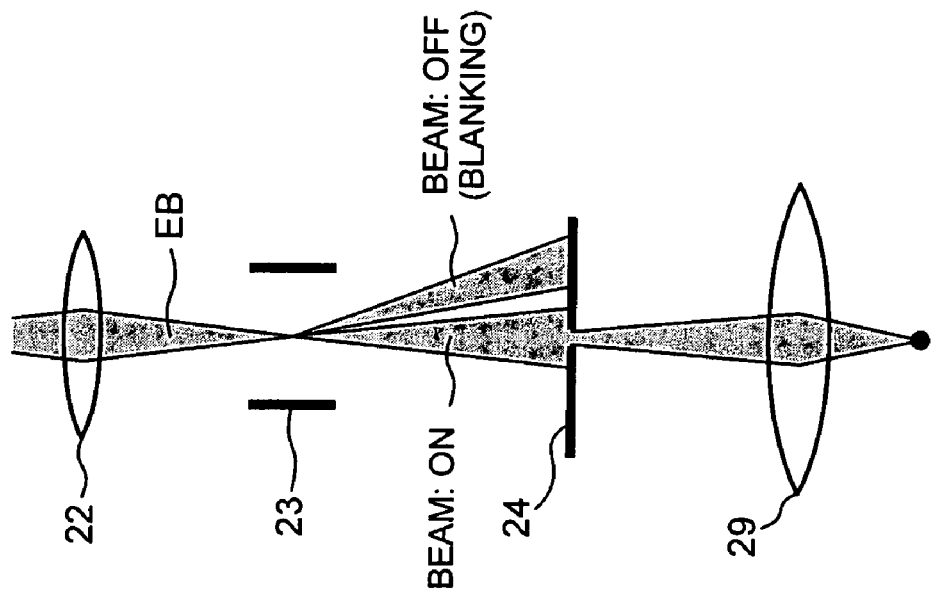
FIG. 7 is a schematic view showing the case of cutting off an electron beam EB (beam: OFF) by blanking.

The deflection control signal in the radial direction, that is, the X direction in the drawing (hereinafter, referred to as X deflection signal) is a ramp wave having the same frequency as the rotational frequency of the spindle motor 17. In response to the X deflection signal having a ramp waveform, the drawing of the circle (track) 15A is started (step S11), and the circle 15A is drawn up to a position A (FIGS. 3 and 4), which is in the vicinity of the drawing start point 15X and does not reach the drawing start point 15X. The deflection of the electron beam is started at the position A in a direction opposite to the rotational direction (−Y direction) of the substrate 15 and a tangential direction (that is, +Y direction) in response to the Y deflection signal having a ramp wave form (step S12). When the electron beam reaches a position B (that is, the drawing start point 15X of the circle 15A), the electron beam is cut off by the blanking signal (step S13). As shown in FIG. 7, applying a blanking voltage to the blanking electrodes 23 largely deflects the electron beam EB from a restriction of the aperture 24, so that the electron beam EB becomes a state in which the electron beam EB cannot pass through the aperture 24 (i.e., beam: OFF). Thus, the electron beam can be cut off. In this state, the electron beam is further deflected to a position C of the circle 15A (deflection in the direction opposite to the rotational direction of the substrate 15) (step S14). The position C is at a distance of DY/2 from the position B in the +Y direction.

When the electron beam reaches the position C in the circle 15A, the electron beam is deflected in an opposite direction (the rotational direction and the tangential direction of the substrate 15, that is, −Y direction in the drawing). The electron beam is also deflected in the radial direction (that is, +X direction in the drawing), so as to switch and shift the electron beam to a position D of the circle 15B (step S15). Then, in response to the Y deflection signal with the ramp waveform, the electron beam is deflected from the position D in the direction opposite to the rotational direction and the tangential direction (+Y direction in the drawing) (step S16).

When the electron beam reaches a position E (that is, a position 15Y) of the circle 15B, the blanking electrodes 23 cancel the blanking (i.e., beam: ON) (step S17), so that the electron beam EB comes to pass through the aperture 24. The position D is at a distance of DY/2 from the position E in the −Y direction. Thus, drawing (exposure) starts again from the position E. Accordingly, the electron beam is in a blanked state (beam: OFF) during a period from the position B to the position C of the circle 15A, a period of carrying out X deflection and Y deflection from the position C of the circle 15A to the position D of the circle 15B, and a period from the position D to the position E of the circle 15B, and hence drawing (exposure) is not carried out. In this embodiment, the position B and the position E are the drawing start points of the respective circles, and also the drawing connection points. The position B and the position E are on a line in the same radial direction being the reference of drawing (hereinafter, also referred to as reference radial line). The positions B and E are reference positions of the concentric circles 15A and 15B, respectively. The reference radial line, for example, may be set so that the drawing connection point of each circle is in the reference radial line. Otherwise, as described later, the reference radial line may be set so as to be the center position of overwriting, when the overwriting is carried out. The reference radial line is not limited to these, but can be set appropriately.

From the position E to a position F of the circle 15B, drawing is carried out by deflecting the electron beam in the +Y direction in response to the Y deflection signal with the ramp waveform (step S18). In other words, the deflection by the Y deflection signal with the ramp waveform is ended in the position F, and the drawing of the circle 15B continues.

Repeating the foregoing operation makes it possible to draw the concentric patterns. A condition that the start point of a drawn line of the circle coincides with the end point is V=DY/Tb (1−Tb/Ty), wherein V represents movement velocity of the substrate, DY represents the amount of deflection by the Y deflection signal between the position C and the position D, Ty represents time period between the position A to the position F, and Tb represents blanking time.

According to the present invention, as described above, when drawing transition is performed from one circle to another circle, the electron beam is deflected not only in the rotational radial direction but also in the tangential direction opposite to the rotational (moving) direction of the substrate. Also in a drawing connection section of the circle, the electron beam is deflected to the rotational tangential direction. Thus, it is possible to draw the circle (track) in such a manner that the start point precisely connects to the end point. Even if there is rotational fluctuation in a rotational stage, it is possible to connect the circle with high precision.

Second Embodiment

A second embodiment of the present invention will be hereinafter described with reference to the drawings.

Figure 8:
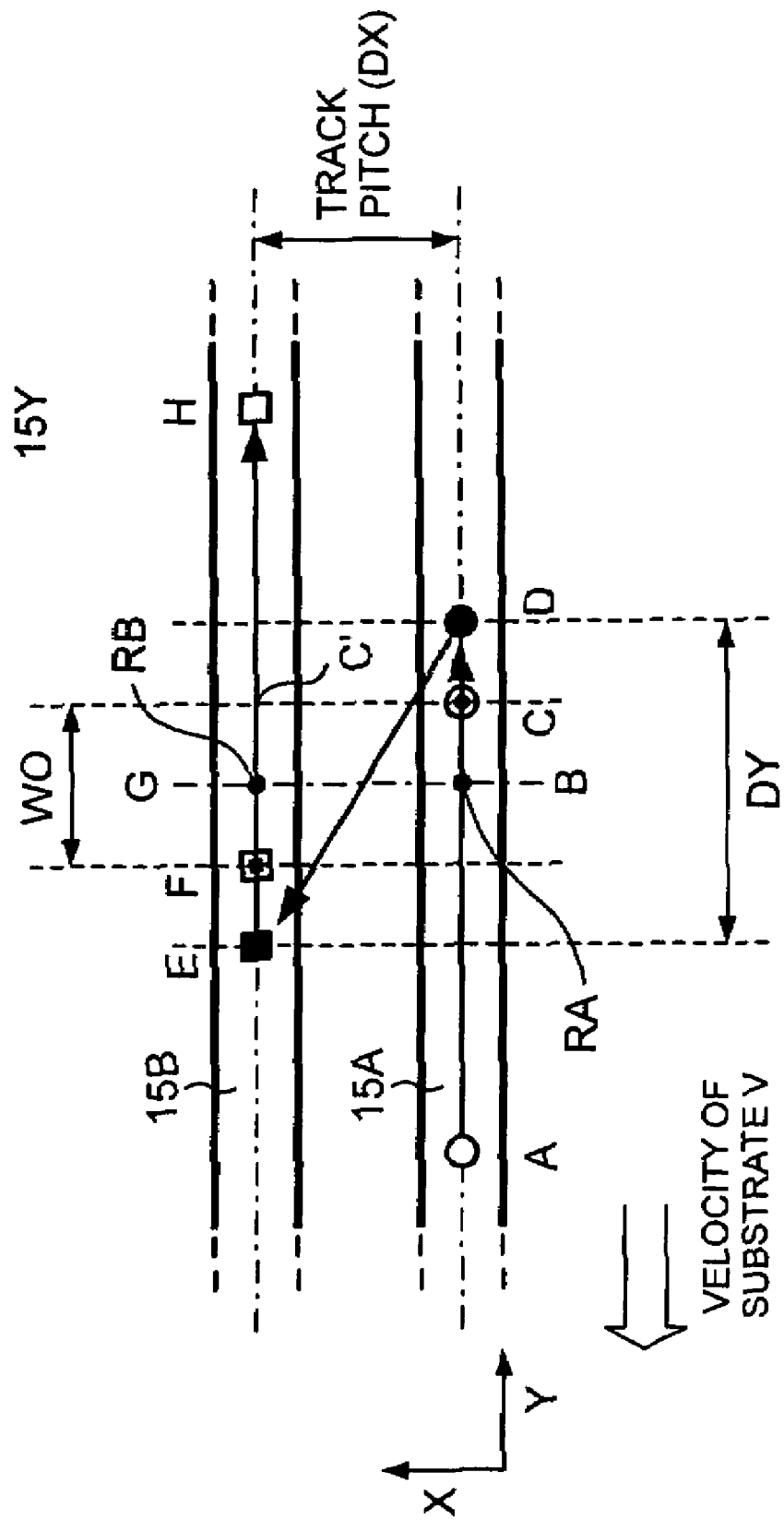
FIG. 8 is a schematic plan view for illustrating deflection control in a second embodiment when drawing transition is performed from the circle 15A to the circle 15B.
Figure 9:
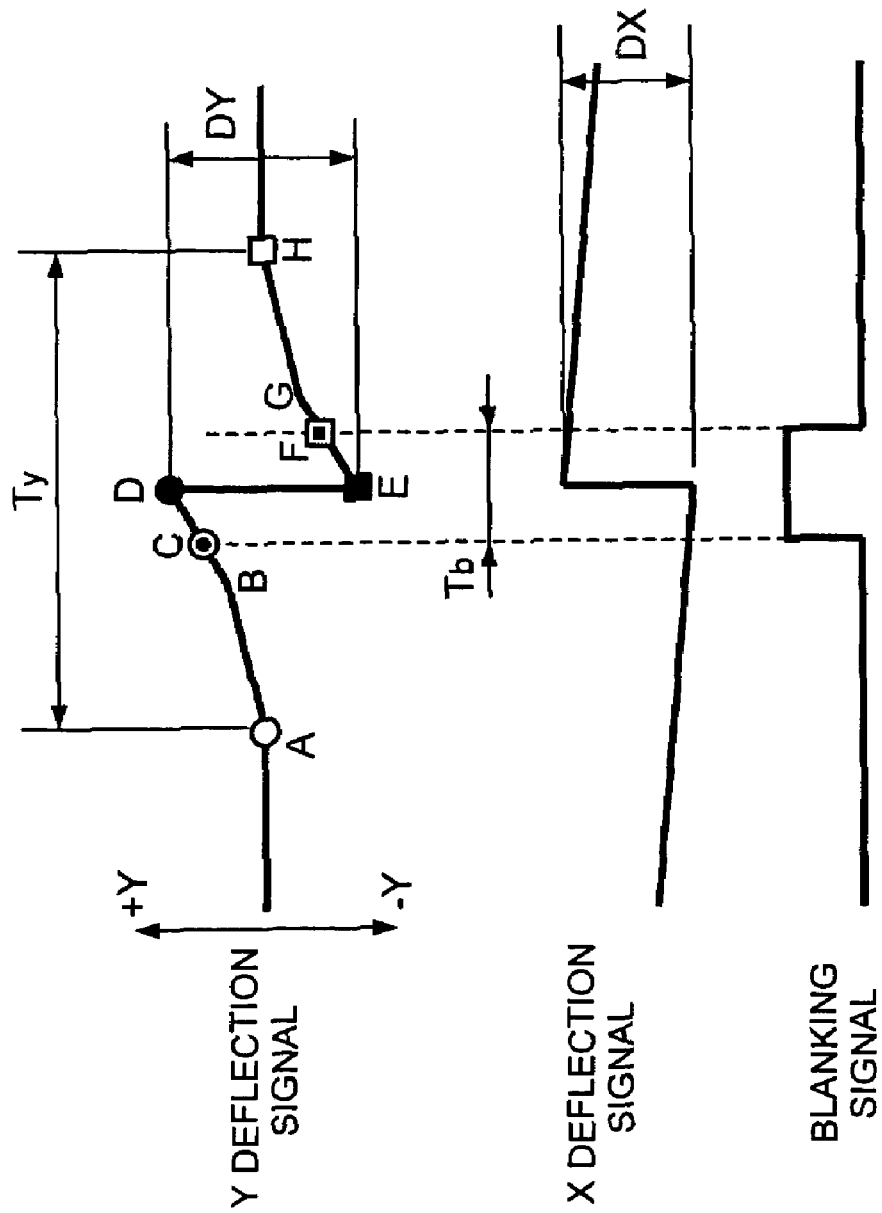
FIG. 9 is a time chart corresponding to FIG. 8 showing the blanking control signal and the deflection control signals in the X and Y directions.

FIG. 8 is a schematic plan view which illustrates the deflection control when drawing transition is performed from the circle 15A to the circle 15B, and the neighborhood of drawing connection points (start points and end points) is enlarged. FIG. 9 is a time chart corresponding to FIG. 8 which shows the blanking control signal and the deflection control signals in the X and Y directions.

As in the case of the foregoing first embodiment, the electron beam starts being deflected in a position A near a reference position RA of the circle 15A in the tangential direction (+Y direction in the drawing) opposite to the rotational (moving) direction of the substrate 15, in response to the Y deflection signal having the ramp waveform. In this embodiment, after deflection in the +Y direction starts, deflection velocity is increased from a position B (for example, the reference position RA), and the electron beam is cut off (beam: OFF) by blanking in a position C passing the reference position RA in response to the blanking signal.

Then, after moving to a position D with deflecting, the electron beam is deflected in an opposite direction (−Y direction in the drawing) and in the direction of the next circle (track) 15B (+X direction in the drawing), so that the electron beam is shifted to a position E of the circle 15B at high speed. Then, in response to the Y deflection signal having the ramp waveform, the electron beam is deflected in the tangential direction (+Y direction in the drawing) until reaching a position F. The position F is set before a reference position RB in a reference radial line in the circle 15B. The blanking is canceled in the position F to apply the electron beam EB to the substrate 15 (beam: ON). The deflection velocity is reduced in a position G (for example, the position RB in the reference radial line) of the circle 15B, and then deflection by the Y deflection signal with the ramp waveform is ended in a position H.

Repeating the foregoing operation makes it possible to draw the concentric patterns. In the first embodiment, the drawing start point and the drawing end point are set at reference positions, and blanking control is carried out in such a manner that overwriting does not occur. When repeating the foregoing procedure draws the concentric circles, however, an overwritten portion occurs. In other words, taking the circle 15B as an example, when a circle 15C is drawn following the circle 15B in a similar manner, a section from the position F of the circle 15B to a drawing end position C' of the circle 15B (a position corresponding to the position C in the circle 15B) becomes the overwritten portion (WO). Namely, the deflection and the blanking control are carried out in such a manner that the overwritten portion (WO) occurs in the vicinity of the reference positions (RA and RB) of the circles 15A and 15B.

Therefore, it is possible to draw the circle which precisely connects at the start point and the end point. Also, even if there is rotational fluctuation in the rotational stage, it is possible to connect the circle with high precision.

Third Embodiment

A third embodiment of the present invention will be hereinafter described with reference to drawings.

Figure 10:
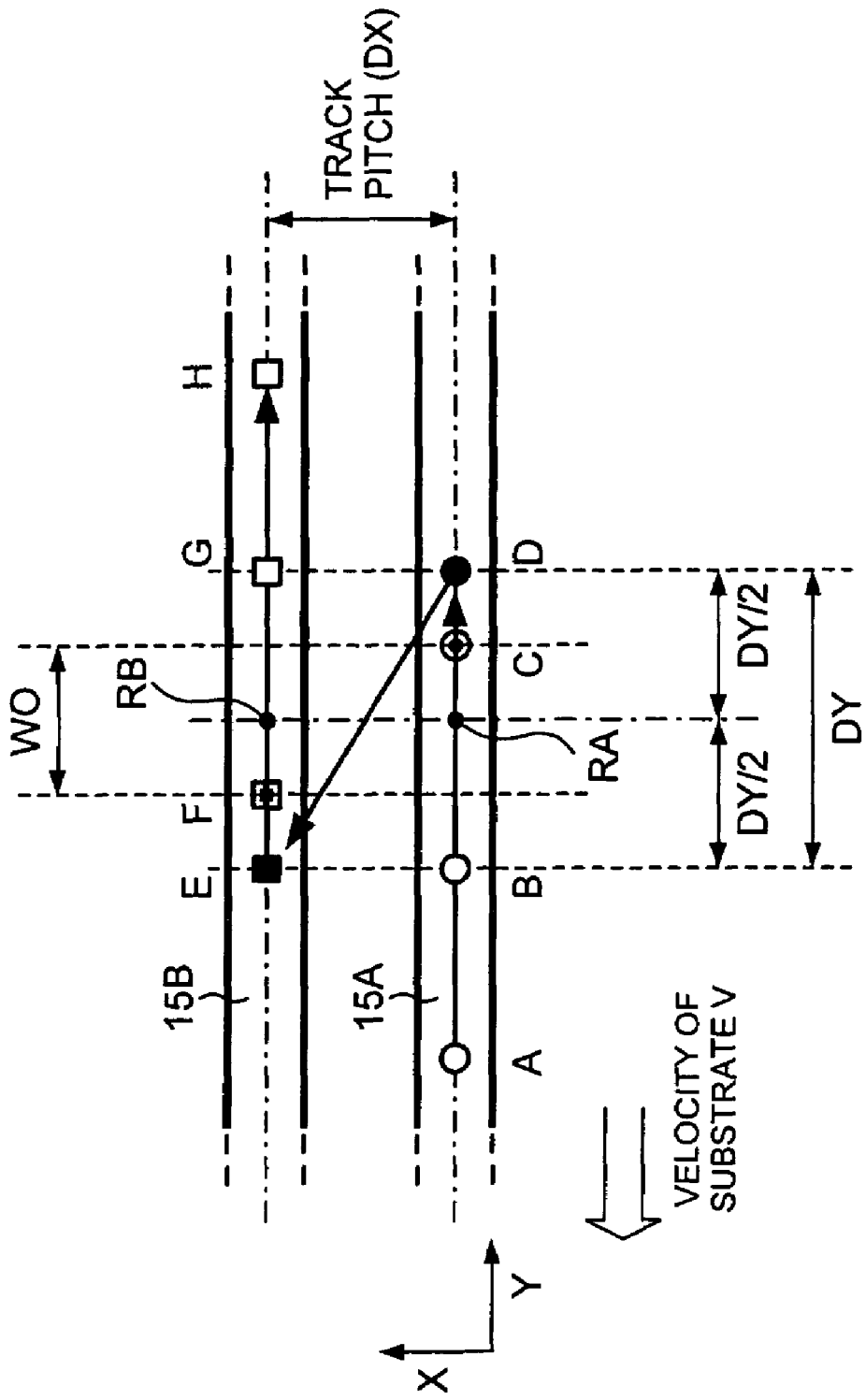
FIG. 10 is a schematic plan view for illustrating the deflection control in a third embodiment when drawing transition is performed from the circle 15A to the circle 15B.
Figure 11:
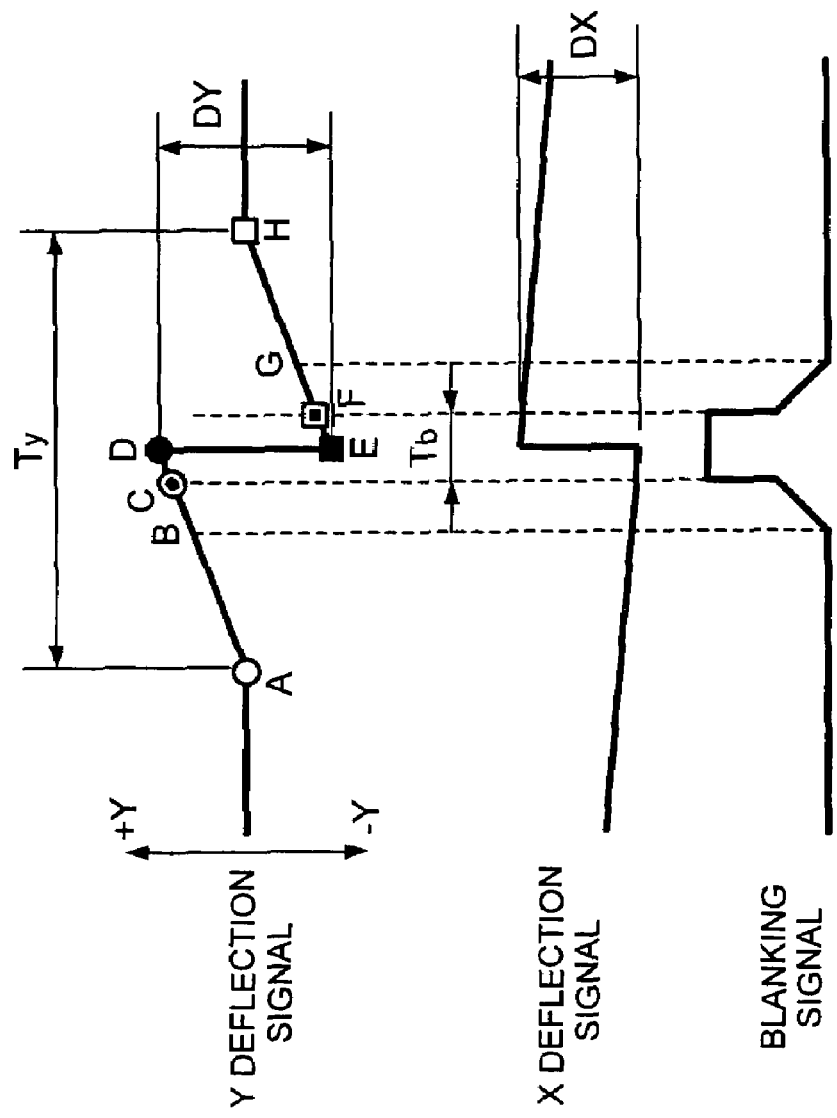
FIG. 11 is a time chart corresponding to FIG. 10 showing the blanking control signal and the deflection control signals in the X and Y directions.

FIG. 10 is a schematic plan view which illustrates the deflection control when drawing transition is performed from the circle 15A to the circle 15B, and the vicinity of drawing connection points is enlarged. FIG. 11 is a time chart corresponding to FIG. 10 which shows the blanking control signal and the deflection control signals in the X and Y directions.

Deflection starts from a position A of the circle 15A in response to the Y deflection signal, and blanking voltage is applied at the predetermined rate of increase from a position B of the circle 15A. In other words, applying the blanking voltage in a ramp form makes it possible to adjust the intensity of the electron beam applied to the substrate. The blanking voltage is rapidly increased in a position C passing a reference position, and the electron beam is completely cut off by blanking (beam: OFF). Namely, the intensity of the electron beam is gradually reduced from the position B to the position C, and completely becomes zero in the position C. Then, after moving to a position D, the electron beam is deflected in the −Y direction and also in the +X direction, so that the electron beam is shifted to a position E of the circle 15B at high speed.

In a position F before reaching a reference position RB of the circle 15B, the blanking voltage is abruptly reduced to a predetermined level in order to apply the electron beam the intensity of which is lower than that in a complete ON state. Then, the blanking voltage is reduced at the predetermined rate of reduction, and the electron beam completely becomes the ON state in a position G (corresponding to the position C of the circle 15A) passing the reference position. After that, deflection by the Y deflection signal with the ramp waveform is ended in a position H.

Repeating the foregoing operation makes it possible to draw a plurality of concentric circles. Therefore, it is possible to draw the circle in which the start point precisely connects to the end point. In addition, even if there is rotational fluctuation in the rotational stage, it is possible to connect the circle with high precision. When repeating the foregoing procedure draws the concentric circles, an overwritten portion occurs. In other words, the deflection and the blanking control are carried out in such a manner that the overwritten portion (WO) occurs in the vicinity of the reference positions RA and RB in the circles 15A and 15B.

The application intensity of the electron beam may be varied at a predetermined rate at least one of before and after the duration of deflecting the electron beam in the radial direction.

Fourth Embodiment

A fourth embodiment of the present invention will be hereinafter described with reference to drawings.

Figure 12:
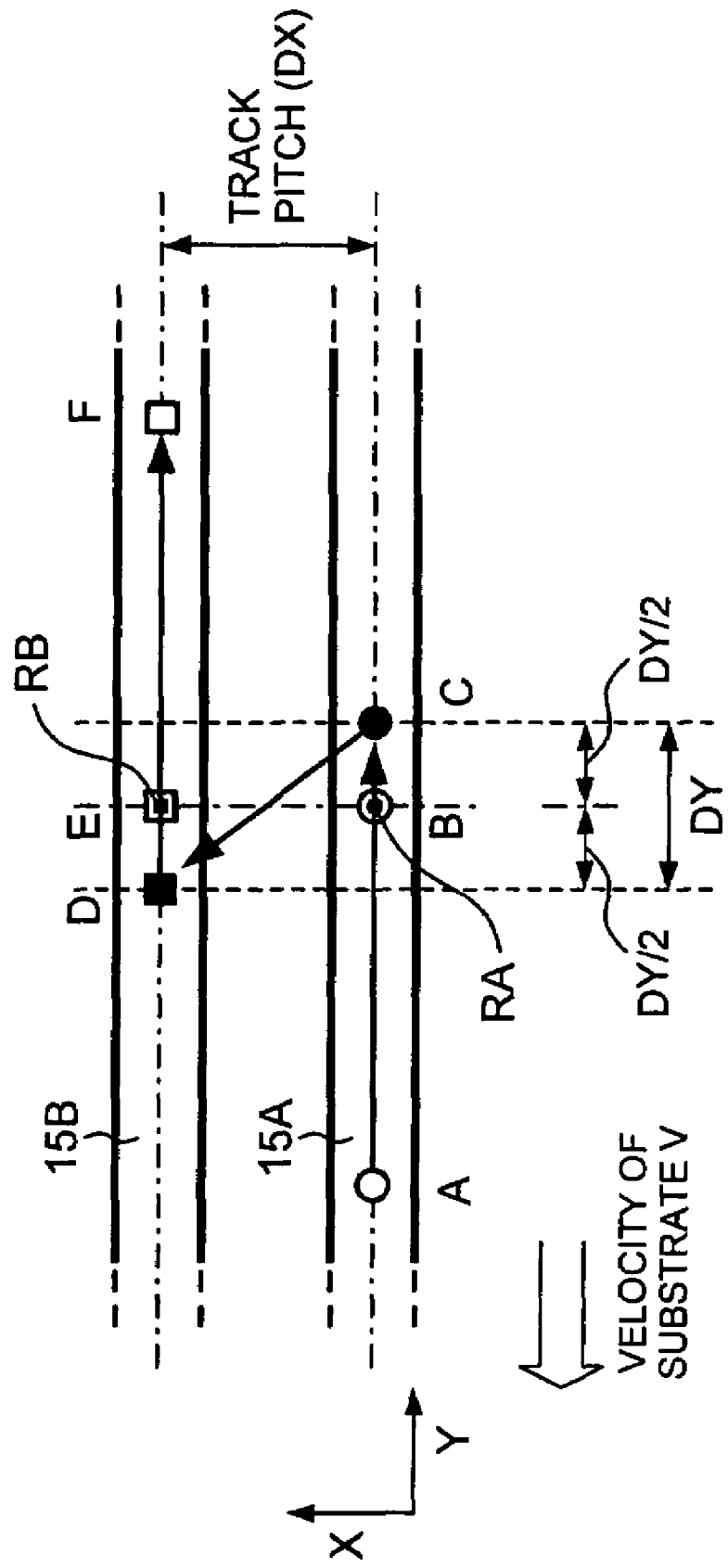
FIG. 12 is a schematic plan view for illustrating the deflection control in a fourth embodiment when drawing transition is performed from the circle 15A to the circle 15B.
Figure 13:
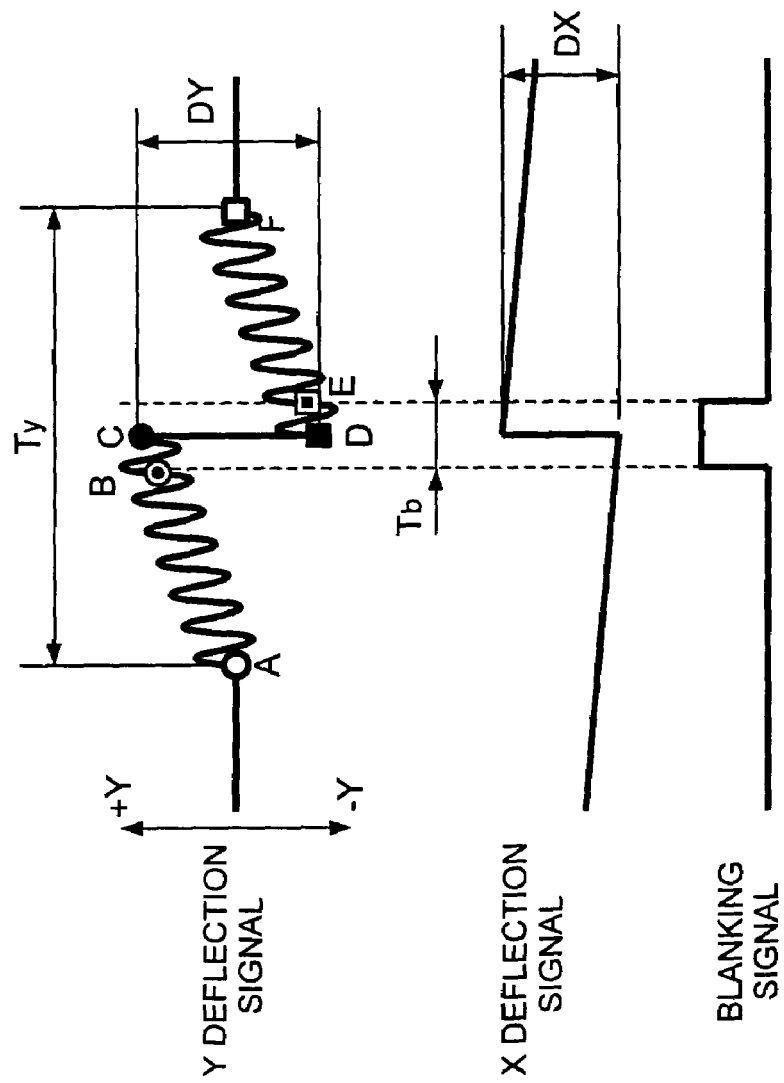
FIG. 13 is a time chart corresponding to FIG. 12 showing the blanking control signal and the deflection control signals in the X and Y directions.

FIG. 12 is a schematic plan view which illustrates the deflection control when drawing transition is performed from the circle 15A to the circle 15B, and the vicinity of drawing connection points is enlarged. FIG. 13 is a time chart corresponding to FIG. 12 which shows the blanking control signal and the deflection control signals in the X and Y directions.

A point of difference between a drawing method according to the foregoing first embodiment and that according to this embodiment is that a sine waveform signal is overlapped with the ramp waveform signal in the deflection control signal in the Y direction. This drawing method is the same as that of the first embodiment for the rest.

To be more specific, responding to the Y deflection signal having the sine waveform, the electron beam is deflected in the tangential direction (±Y direction in the drawing) in the period between a position A and a position C. The electron beam is deflected in the tangential direction (−Y direction in the drawing) and also in the radial direction (+X direction in the drawing) from the position C, so that the electron beam is shifted to a position D at high speed. Then, the electron beam is deflected in the tangential direction (±Y direction in the drawing) in the period between the position D and a position F in response to the Y deflection signal with the sine waveform. As in the case of the first embodiment, the electron beam is cut off (beam: OFF) by blanking in the period between the position B and a position E being drawing connection points. A cutoff period of the electron beam, however, may be set so as to carry out overwriting.

As described above in detail, according to the present invention, when drawing transition is performed from one circle to another, the electron beam is deflected not only the rotational radial direction but also the rotational tangential direction of the rotation (movement) of the substrate. Also in the drawing connection section of the circle, the electron beam is deflected in the rotational tangential direction opposite to the rotational direction of the substrate. Therefore, it is possible to draw the circle (track) which precisely connects at the start point and the end point. Even if there is rotational fluctuation in the rotational stage, the circle can be connected with high precision.

In the foregoing embodiments, lithography (exposure) of the concentric circles is performed by using the electron beam. The present invention, however, is applicable in the case of using another beam such as an optical beam and the like instead of the electron beam.

What is claimed is:

1. An electron beam lithography apparatus for concentrically drawing a plurality of circles on a substrate by applying an electron beam while rotating the substrate, comprising:
    a beam deflection portion for deflecting the electron beam to change an irradiation position of the electron beam;
    a synchronization signal generation portion for generating a synchronization signal in synchronization with the rotation of the substrate;
    a controller for controlling the beam deflection portion on the basis of the synchronization signal in order to deflect the electron beam in a rotational radial direction of the substrate and in a rotational tangential direction of the substrate relative to the circle path and in the same rotational direction of the substrate, while drawing transition is performed from one circle to another circle; and
    a beam cutoff portion for cuffing off the irradiation of the electron beam on the substrate, for a period when the electron beam is deflected in the rotational radial direction.

2. The electron beam lithography apparatus according to claim 1, wherein the controller deflects the electron beam in the rotational tangential direction of the substrate relative to the circle path and in the same direction as the movement of the substrate before drawing transition is performed from the one circle to the another circle.

3. The electron beam lithography apparatus according to claim 1, wherein the controller deflects the electron beam in the rotational tangential direction relative to the circle path to overwrite a portion of the circle including a drawing connection position.

4. The electron beam lithography apparatus according to claim 1, wherein the beam cutoff section varies an intensity of the electron beam applied to the substrate at a predetermined rate before or after a period when the electron beam is deflected in the rotational radial direction.

5. An electron beam lithography method for drawing a plurality of circles on a substrate by applying an electron beam while rotating the substrate, the method comprising:
    a transition controlling step of deflecting the electron beam in a rotational radial direction of the substrate and in a rotational tangential direction of the substrate relative to the circle path and in the same rotational direction of the substrate, upon performing drawing transition from one circle to another circle; and
    a beam cutoff step of cutting off the irradiation of the electron beam on the substrate, for a period when the electron beam is deflected in the rotational radial direction.

6. The electron beam lithography method according to claim 5, wherein the transition controlling step includes a step of deflecting the electron beam in the rotational tangential direction of the substrate relative to the circle path and in the same direction as the movement of the substrate before drawing transition is performed from the one circle to the another circle.

7. The electron beam lithography method according to claim 5, wherein the transition controlling step deflects the electron beam in the rotational tangential direction relative to the circle path to overwrite a portion of the circle including a drawing connection position.

8. The electron beam lithography method according to claim 5, comprising the step of varying an intensity of the electron beam applied to the substrate at a predetermined rate before or after a period when the electron beam is deflected in the rotational radial direction.

9. An apparatus comprising a drawing controller for applying an electron beam on a substrate to draw a plurality of circles, configured for deflecting the electron beam in a rotational radial direction of the substrate and in a rotational tangential direction of the substrate relative to the circle path and in the same rotational direction of the substrate, upon performing drawing transition from one circle to another circle.

10. The apparatus recited in claim 9, wherein the drawing controller is further configured for cutting off the irradiation of the electron beam on the substrate, for a period when the electron beam is deflected in the rotational radial direction.

11. The apparatus recited in claim 9, wherein before the drawing transition from the one circle to the another is performed, the electron beam is deflected in the rotational tangential direction of the substrate relative to the circle path and in the same rotational direction of the substrate.

12. The apparatus recited in claim 9, wherein the drawing controller is configured for deflecting the electron beam in the rotational tangential direction relative to the circle path to overwrite a portion of the circle including a drawing connection position.

13. The apparatus recited in claim 9, wherein the drawing controller is configured for varying an intensity of the electron beam applied to the substrate at a predetermined rate before or after a period when the electron beam is deflected in the rotational radial direction.

* * * * *